United States Patent
Sato (10) Patent No.: US 11,092,624 B2
(45) Date of Patent: Aug. 17, 2021

(54) VOLTAGE MONITORING CIRCUIT WITH ADJUSTABLE THRESHOLDS

(71) Applicant: Rohm Co., Ltd., Kyoto (JP)

(72) Inventor: Kiminobu Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 276 days.

(21) Appl. No.: 16/268,767

(22) Filed: Feb. 6, 2019

(65) Prior Publication Data

US 2020/0049742 A1 Feb. 13, 2020

(30) Foreign Application Priority Data

Aug. 8, 2018 (JP) .............................. JP2018-149086

(51) Int. Cl.
| | | |
|---|---|---|
| *G01R 19/165* | (2006.01) | |
| *H02M 3/157* | (2006.01) | |
| *H02M 3/158* | (2006.01) | |
| *H02H 3/20* | (2006.01) | |

(52) U.S. Cl.
CPC ...... *G01R 19/16552* (2013.01); *H02M 3/157* (2013.01); *H02M 3/158* (2013.01); *H02H 3/207* (2013.01)

(58) Field of Classification Search
CPC .......... G01R 19/1659; G01R 19/16566; G01R 19/16595; G01R 19/16552; G01R 19/16538; H02H 3/207; H02H 7/1213; H02M 3/157; H02M 3/158

See application file for complete search history.

(56) References Cited

U.S. PATENT DOCUMENTS

| | | | | |
|---|---|---|---|---|
| 4,156,280 A | * | 5/1979 | Griess .............. | G01R 19/16528 327/78 |
| 4,503,479 A | * | 3/1985 | Otsuka .................... | H02H 3/207 123/480 |
| 5,969,657 A | * | 10/1999 | Dempsey .............. | H03M 1/682 341/145 |
| 8,063,805 B1 | * | 11/2011 | Eid .......................... | G05F 1/56 341/142 |
| 2008/0278133 A1 | * | 11/2008 | Lee ........................ | H02H 3/207 323/284 |
| 2014/0313608 A1 | * | 10/2014 | Nakabayashi ...... | H02M 3/1584 360/39 |
| 2016/0033984 A1 | * | 2/2016 | Lee ......................... | G05F 1/575 323/280 |
| 2020/0001887 A1 | * | 1/2020 | Srivastava ........ | G01R 19/16538 |

FOREIGN PATENT DOCUMENTS

JP 2007-49845 2/2007

* cited by examiner

*Primary Examiner* — Harry R Behm
(74) *Attorney, Agent, or Firm* — Fish & Richardson P.C.

(57) ABSTRACT

A voltage monitoring circuit for monitoring an output voltage of a power supply device. The power supply device includes a voltage conversion part that converts an input voltage to the output voltage according to a difference between a feedback voltage based on the output voltage and a first reference voltage. The voltage monitoring circuit includes: a threshold voltage generation circuit configured to generate a threshold voltage from the first reference voltage; and a comparator configured to compare the threshold voltage with the feedback voltage.

17 Claims, 10 Drawing Sheets

VOLTAGE MONITORING CIRCUIT WITH ADJUSTABLE THRESHOLDS

CROSS-REFERENCE TO RELATED APPLICATION

This application is based upon and claims the benefit of priority from Japanese Patent Application No. 2018-149086, filed on Aug. 8, 2018, the entire contents of which are incorporated herein by reference.

TECHNICAL FIELD

The present disclosure relates to a voltage monitoring circuit for monitoring an output voltage of a power supply device.

BACKGROUND

Power supply devices including a DC/DC converter for converting an input voltage to an output voltage are widely known. The DC/DC converter attempts to stabilize the output voltage by converting the input voltage to the output voltage according to a difference between a feedback voltage based on the output voltage and a reference voltage.

Further, a voltage monitoring circuit for monitoring an output voltage of a power supply device is also widely known. The voltage monitoring circuit known in the related art includes an overvoltage monitoring circuit for monitoring whether or not an output voltage of a power supply device is an overvoltage. The overvoltage monitoring circuit known in the related art monitors whether or not the output voltage of the power supply device is an overvoltage based on the result of comparison between a divided voltage of the output voltage of the power supply device and a reference voltage Vref2.

In the related art, the reference voltage Vref used in the DC/DC converter and the reference voltage Vref2 used in the voltage monitoring circuit are independent of each other. For this reason, there is a need for absolute accuracy of each of the reference voltage Vref used in the DC/DC converter and the reference voltage Vref2 used in the voltage monitoring circuit. This makes it difficult to have the output voltage of the power supply and the overvoltage fall within predetermined setting ranges, respectively.

SUMMARY

Some embodiments of the present disclosure provide a voltage monitoring circuit capable of easily enhancing a monitoring accuracy.

According to an embodiment of the present disclosure, there is provided a voltage monitoring circuit for monitoring an output voltage of a power supply device, which includes a voltage conversion part that converts an input voltage to the output voltage according to a difference between a feedback voltage based on the output voltage and a first reference voltage, including: a threshold voltage generation circuit configured to generate a threshold voltage from the first reference voltage; and a comparator configured to compare the threshold voltage with the feedback voltage.

In some embodiments, the threshold voltage generation circuit includes a first threshold voltage generation circuit and a second threshold voltage generation circuit, wherein the comparator includes a first comparator and a second comparator, the first threshold voltage generation circuit generates a first threshold voltage, the second threshold voltage generation circuit generates a second threshold voltage smaller than the first threshold voltage, the first comparator compares the first threshold voltage with the feedback voltage, and the second comparator compares the second threshold voltage with the feedback voltage.

In some embodiments, the first threshold voltage generation circuit includes a first D/A converter and is configured to change the first threshold voltage according to first digital data inputted to the first D/A converter, and the second threshold voltage generation circuit includes a second D/A converter and is configured to change the second threshold voltage according to second digital data inputted to the second D/A converter.

In some embodiments, the first threshold voltage generation circuit includes a current mirror circuit and is configured to change an input current of the current mirror circuit according to the first digital data inputted to the first D/A converter, and an output current of the current minor circuit is approximately proportional to a value obtained by subtracting the first reference voltage from the first threshold voltage.

In some embodiments, the second threshold voltage generation circuit includes a voltage division circuit configured to generate the second threshold voltage which is a divided voltage of the first reference voltage, wherein a voltage division ratio of the voltage division circuit is changed according to the second digital data inputted to the second D/A converter.

In some embodiments, the threshold voltage generation circuit includes a third D/A converter and is configured to change the threshold voltage according to third digital data inputted to the third D/A converter.

In some embodiments, the circuit further includes a determination circuit configured to set a predetermined range based on a third reference voltage independent of a second reference voltage and to determine whether or not the second reference voltage falls within the predetermined range, wherein the first reference voltage is generated from the second reference voltage.

In some embodiments, the determination circuit includes a fourth D/A converter configured to generate an upper limit voltage corresponding to an upper limit of the predetermined range from the third reference voltage, and a fifth D/A converter configured to generate a lower limit voltage corresponding to a lower limit of the predetermined range from the third reference voltage, to change the upper limit voltage according to fourth digital data inputted to the fourth D/A converter, and to change the lower limit voltage according to fifth digital data inputted to the fifth D/A converter.

According to another embodiment of the present disclosure, there is provided a semiconductor integrated circuit device, including: a reference voltage generation circuit configured to generate a first reference voltage; at least a part of a voltage conversion part; and the voltage monitoring circuit.

In some embodiments, the reference voltage generation circuit includes a sixth D/A converter configured to generate the first reference voltage from the second reference voltage and to change the first reference voltage according to sixth digital data inputted to the sixth D/A converter.

In some embodiments, the device further includes a switch provided between the reference voltage generation circuit and the threshold voltage generation circuit.

According to another embodiment of the present disclosure, there is provided a vehicle including the semiconductor integrated circuit device.

DETAILED DESCRIPTION

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

<1. Voltage Monitoring Circuit>

Figure 1:
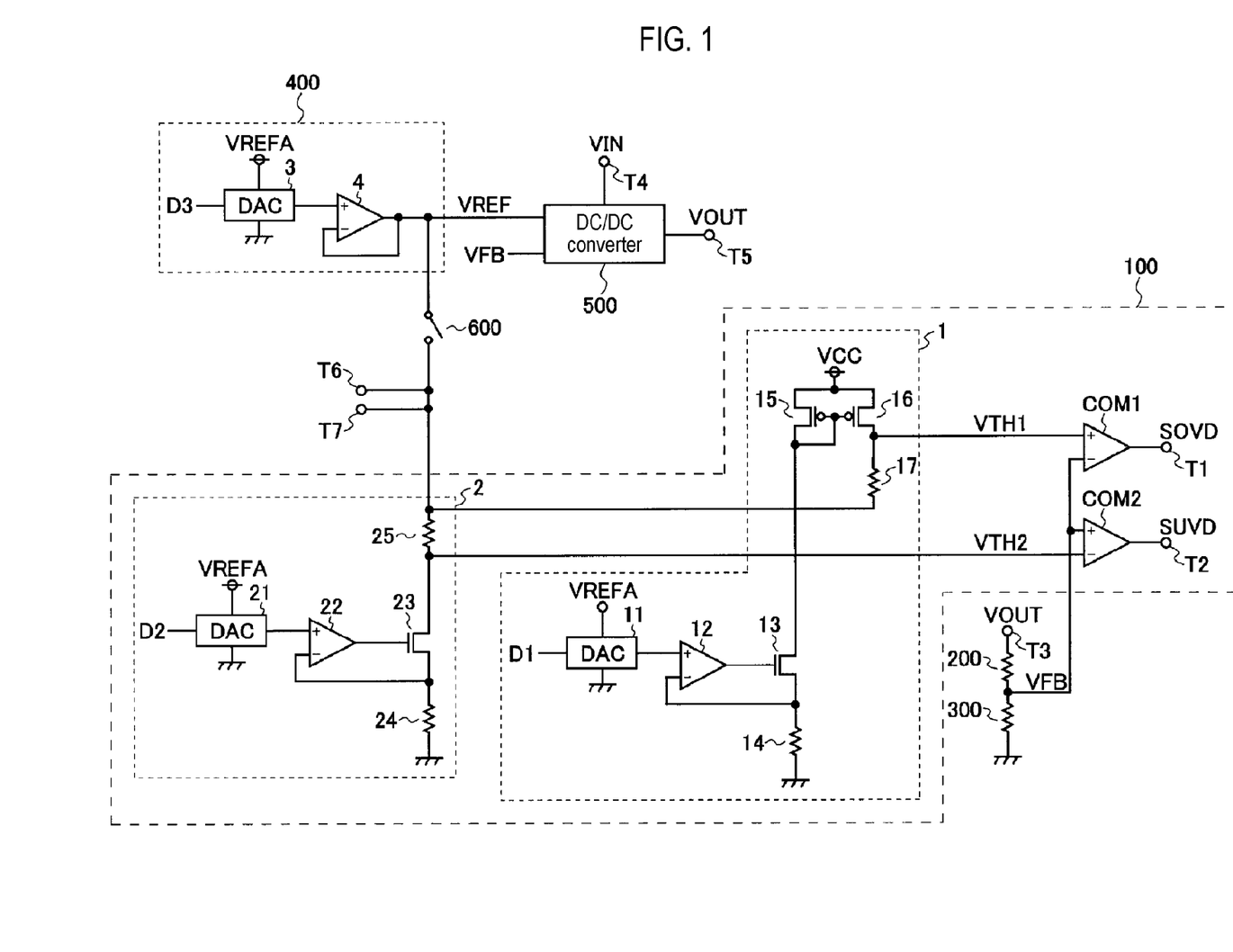
FIG. 1 is a diagram showing a configuration example of a voltage monitoring circuit.

FIG. 1 is a diagram showing a configuration example of a voltage monitoring circuit 100. The voltage monitoring circuit 100 includes a first threshold voltage generation circuit 1, a second threshold voltage generation circuit 2, a first comparator COM1, and a second comparator COM2.

The first threshold voltage generation circuit 1 includes a current mirror circuit constituted by PMOS transistors 15 and 16. The first threshold voltage generation circuit 1 further includes a first D/A converter 11, an operational amplifier 12, an NMOS transistor 13, and resistors 14 and 17. The first D/A converter 11 is an example of a "first D/A converter" recited in the claims and is also an example of a "third D/A converter" recited in the claims. The reference voltage VREF to be described later is an example of a "first reference voltage" recited in the claims, the reference voltage VREFA to be described later is an example of a "second reference voltage" recited in the claims, and the reference voltage VREFB to be described later is an example of a "third reference voltage" recited in the claims.

The input current of the current mirror circuit is determined by a drain-source voltage of the NMOS transistor 13 and a resistance value of the resistor 14. First digital data D1 is supplied to an input terminal of the first D/A converter 11. The first D/A converter 11 divides the reference voltage VREFA at a voltage division ratio corresponding to the first digital data D1, and outputs an analog voltage which is a divided voltage of the reference voltage VREFA. An output terminal of the first D/A converter 11 is connected to a non-inverting input terminal of the operational amplifier 12.

An inverting input terminal of the operational amplifier 12 is connected to a source of the NMOS transistor 13. An output terminal of the operational amplifier 12 is connected to a gate of the NMOS transistor 13.

The drain-source voltage of the NMOS transistor 13 varies depending on the first digital data D1. Therefore, the input current of the current mirror circuit varies depending on the first digital data D1. The larger the value of the first digital data D1 is, the larger the input current of the current mirror circuit becomes.

The output current of the current mirror circuit is a value obtained by multiplying the input current of the current mirror circuit by a current mirror ratio. The output current of the current mirror circuit is substantially proportional to a value obtained by subtracting a reference voltage VREF from a first threshold voltage VTH1. Therefore, the larger the value of the first digital data D1 is, the larger the first threshold voltage VTH1 becomes.

The first threshold voltage VTH1 is substantially equal to a sum of the reference voltage VREF and the value obtained by multiplying the output current of the current mirror circuit by the resistance value of the resistor 17. That is, the first threshold voltage VTH1 is a voltage obtained by adding a first predetermined value to the reference voltage VREF.

The first comparator COM1 compares the first threshold voltage VTH1 with a feedback voltage VFB, and asserts a LOW active overvoltage detection signal SOVD if the feedback voltage VFB exceeds the first threshold voltage VTH1. The overvoltage detection signal SOVD is outputted from a terminal T1 to the outside of the voltage monitoring circuit 100.

The second threshold voltage generation circuit 2 includes a voltage division circuit constituted by an NMOS transistor 23 and resistors 24 and 25. The second threshold voltage generation circuit 2 further includes a second D/A converter 21 and an operational amplifier 22. The second D/A converter 21 is an example of a "second D/A converter" recited in the claims, and is also another example of a "third D/A converter" recited in the claims.

The second threshold voltage VTH2, which is a divided voltage of the reference voltage VREF, is determined by a resistance value of the resistor 25, a voltage of the D/A converter 21, and a resistance value of the resistor 24. Second digital data D2 is supplied to an input terminal of the second D/A converter 21. The second D/A converter 21 divides the reference voltage VREFA at a division ratio corresponding to the second digital data D2, and outputs an analog voltage, which is a divided voltage of the reference voltage VREFA. An output terminal of the second D/A converter 21 is connected to a non-inverting input terminal of the operational amplifier 22. An inverting input terminal of the operational amplifier 22 is connected to a source of the NMOS transistor 23. An output terminal of the operational amplifier 22 is connected to a gate of the NMOS transistor 23. The current flowing through the resistor 24 is obtained by dividing a source voltage of the NMOS transistor 23 by a resistance value of the resistor 24. Since the same current flows through the resistor 25, the second threshold voltage VTH2 is substantially equal to a value obtained by subtracting the reference voltage VREF and the value obtained by multiplying the current flowing through the resistor 24 by a resistance value of the resistor 25.

The drain-source voltage of the NMOS transistor 23 varies depending on the second digital data D2. Therefore, the second threshold voltage VTH2 varies depending on the second digital data D2. The larger the value of the second digital data D2 is, the smaller the second threshold voltage VTH2 becomes.

The second threshold voltage VTH2 is a voltage obtained by subtracting a second predetermined value from the reference voltage VREF.

The second comparator COM2 compares the second threshold voltage VTH2 with a feedback voltage VFB, and asserts a LOW active low voltage detection signal SUVD if the feedback voltage VFB is less than the second threshold voltage VTH2. The low voltage detection signal SUVD is outputted from a terminal T2 to the outside of the voltage monitoring circuit 100.

A resistor 200, a resistor 300, a reference voltage generation circuit 400, and a DC/DC converter 500 shown in FIG. 1 are circuits related to the voltage monitoring circuit 100. The DC/DC converter 500 is an example of a "voltage conversion part" recited in the claims.

The resistors 200 and 300 divide the output voltage VOUT of the DC/DC converter 500 applied to a terminal T3, thereby generating a feedback voltage VFB.

The reference voltage generation circuit 400 includes a third D/A converter 3 and an operational amplifier 4. The third D/A converter 3 is an example of a "sixth D/A converter" recited in the claims. Third digital data D3 is supplied to an input terminal of the third D/A converter 3. The third D/A converter 3 divides the reference voltage VREFA at a voltage division ratio corresponding to the third digital data D3, and outputs an analog voltage which is a divided voltage of the reference voltage VREFA. An output terminal of the third D/A converter 3 is connected to a non-inverting input terminal of the operational amplifier 4. An inverting input terminal of the operational amplifier 4 is connected to an output terminal of the operational amplifier 4. The reference voltage VREF is outputted from the output terminal of the operational amplifier 4. The reference voltage VREF varies depending on the third digital data D3. The larger the value of the third digital data D3 is, the larger the reference voltage VREF becomes.

The reference voltage VREF is supplied to the DC/DC converter 500. The reference voltage VREF is also supplied to the voltage monitoring circuit 100 via a switch 600. The switch 600 is normally turned on.

The DC/DC converter 500 converts the input voltage VIN applied to a terminal T4 to an output voltage VOUT, and applies the output voltage VOUT to a terminal T5. The DC/DC converter 500 converts the input voltage VIN to the output voltage VOUT according to the difference between the feedback voltage VFB and the reference voltage VREF. In the present embodiment, the feedback voltage VFB is a divided voltage of the output voltage VOUT. However, unlike the present embodiment, the feedback voltage VFB may be the output voltage VOUT itself.

Figure 2:
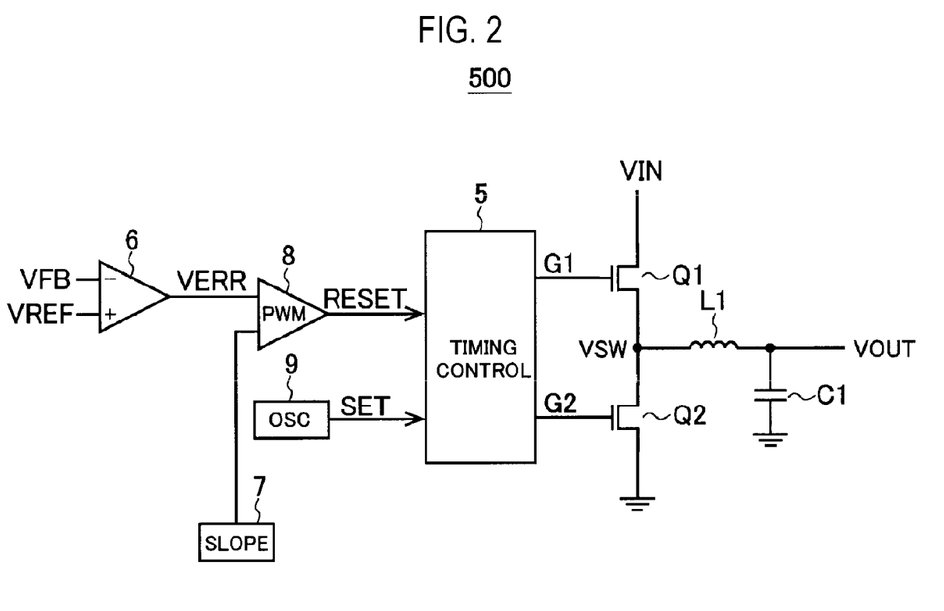
FIG. 2 is a diagram showing a configuration example of a DC/DC converter.

FIG. 2 is a diagram showing a configuration example of the DC/DC converter 500. The DC/DC converter 500 of this configuration example is a step-down DC/DC converter and includes a timing control circuit 5, an upper MOS transistor Q1, a lower MOS transistor Q2, an inductor L1, an output capacitor C1, an error amplifier 6, a slope circuit 7, a PWM comparator 8, and an oscillator 9.

The timing control circuit 5 controls ON/OFF of the upper MOS transistor Q1 and ON/OFF of the lower MOS transistor Q2, and generates a gate signal G1 of the upper MOS transistor Q1 and a gate signal G2 of the lower MOS transistor Q2 according to a set signal SET and a reset signal RESET.

The upper MOS transistor Q1 is a PMOS transistor and is an example of an upper switch that conducts or cuts off a current path extending from an input voltage application terminal (terminal T4 shown in FIG. 1) applied with the input voltage VIN to the inductor L1. The source of the upper MOS transistor Q1 is connected to the input voltage application terminal applied with the input voltage VIN. The drain of the upper MOS transistor Q1 is connected to one end of the inductor and the drain of the lower MOS transistor Q2. The gate signal G1 is supplied from the timing control circuit 5 to the gate of the upper MOS transistor Q1. The upper MOS transistor Q1 is turned on when the gate signal G1 is at a low level, and is turned off when the gate signal G1 is at a high level.

The lower MOS transistor Q2 is an NMOS transistor and is an example of a lower switch that conducts or cuts off a current path extending from a ground terminal to the inductor L1. The drain of the lower MOS transistor Q2 is connected to one end of the inductor and the drain of the upper MOS transistor Q1 as described above. The source of the lower MOS transistor Q2 is connected to the ground terminal. The gate signal G2 is supplied from the timing control circuit 5 to the gate of the lower MOS transistor Q2. The lower MOS transistor Q2 is turned on when the gate signal G2 is at a high level, and is turned off when the gate signal G2 is at a low level. A diode may be used as the lower switch instead of the lower MOS transistor Q2.

The upper MOS transistor Q1 and the lower MOS transistor Q2 are complementarily turned on and off under control of the timing control circuit 5. As a result, a pulse-like switch voltage VSW is generated at a connection node between the upper MOS transistor Q1 and the lower MOS transistor Q2. When turning on and off the upper MOS transistor Q1 and the lower MOS transistor Q2, a dead time at which both the upper MOS transistor Q1 and the lower MOS transistor Q2 are turned off may be provided in some embodiments.

The inductor L1 and the output capacitor C1 smoothen the pulse-like switch voltage VSW to generate an output voltage VOUT, which is supplied to an application terminal (terminal T5 shown in FIG. 1) of the output voltage VOUT.

The error amplifier 6 generates an error signal VERR according to the difference between the feedback voltage VFB and the reference voltage VREF.

The slope circuit 7 generates and outputs a slope voltage having a fixed period.

The PWM comparator 8 compares the error signal VERR with the slope voltage outputted from the slope circuit 7 and generates a reset signal RESET which is a comparison signal. Since the slope voltage outputted from the slope circuit 7 has a fixed period, the reset signal RESET becomes a PWM signal.

The oscillator 9 generates a set signal SET which is a clock signal of a predetermined frequency.

Although the configuration of the DC/DC converter 500 has been described herein by taking the step-down DC/DC converter as an example, the DC/DC converter 500 may be a step-up DC/DC converter or a step-up/step-down DC/DC converter. Furthermore, although the configuration of the DC/DC converter 500 has been described herein by taking the voltage mode control type DC/DC converter as an example, the DC/DC converter 500 may be a current mode control type DC/DC converter or the like.

The voltage monitoring circuit 100 described above determines whether or not the output voltage VOUT of the DC/DC converter 500 is an overvoltage, by using, as a determination reference, the first threshold voltage VTH1, which is a voltage obtained by adding the first predetermined value to the reference voltage VREF used in the DC/DC converter 500. Further, the voltage monitoring circuit 100 determines whether or not the output voltage VOUT of the DC/DC converter 500 is a low voltage, by using, as a determination reference, the second threshold voltage VTH2, which is a voltage obtained by subtracting the second predetermined value from the reference voltage VREF used in the DC/DC converter 500. Accordingly, the detection accuracy of the voltage monitoring circuit 100 is determined by the accuracy of the first predetermined value and the second predetermined value. Therefore, the voltage monitoring circuit 100 can be designed more easily than in the conventional method.

Further, in the voltage monitoring circuit 100, it is possible to set the monitoring accuracy of each of the output voltage, the overvoltage, and the low voltage of the DC/DC converter 500 according to the first to third digital data D1 to D3.

Figure 3:
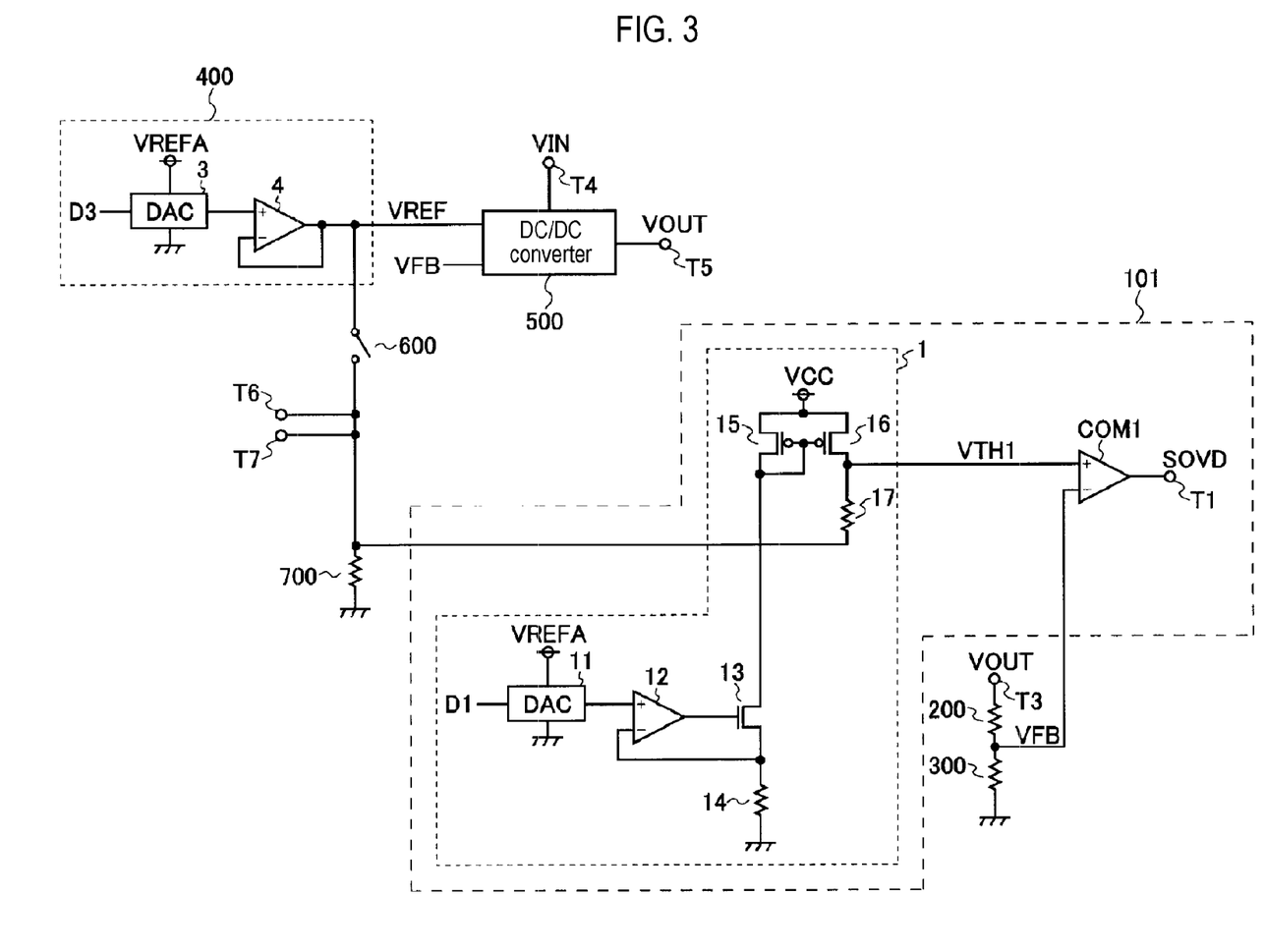
FIG. 3 is a diagram showing a modification of the voltage monitoring circuit.
Figure 4:
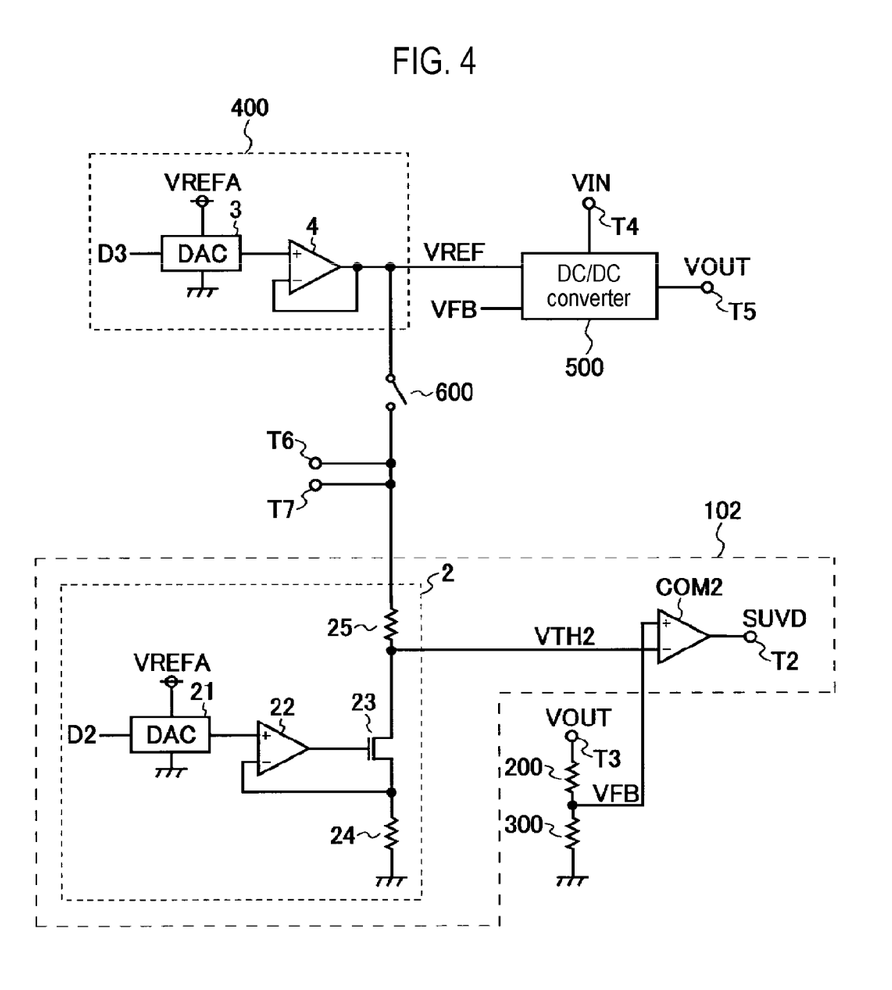
FIG. 4 is a diagram showing another modification of the voltage monitoring circuit.

The voltage monitoring circuit 100 is configured to include the first threshold voltage generation circuit 1, the first comparator COM1, the second threshold voltage generation circuit 2 and the second comparator COM2. However, as in a voltage monitoring circuit 101 shown in FIG. 3, the second threshold voltage generation circuit 2 and the second comparator COM2 may not be provided. As in a voltage monitoring circuit 102 shown in FIG. 4, the first threshold voltage generation circuit 1 and the first comparator COM1 may not be provided.

In some embodiments, each of the voltage monitoring circuits 100 to 102 further includes a determination circuit for determining whether or not the reference voltage VREFA falls within a predetermined range. If the reference voltage VREFA deviates from the design value of the reference voltage VREFA, the reference voltage VREF also deviates from the design value of the reference voltage VREF. As a result, the determination reference of the overvoltage (=first threshold voltage VTH1) deviates from the design value of the first threshold voltage VTH1, and the determination reference of the low voltage (=second threshold voltage VTH2) deviates from the design value of the second threshold voltage VTH2. Thus, the overvoltage monitoring and the low voltage monitoring are not performed as designed.

Figure 5:
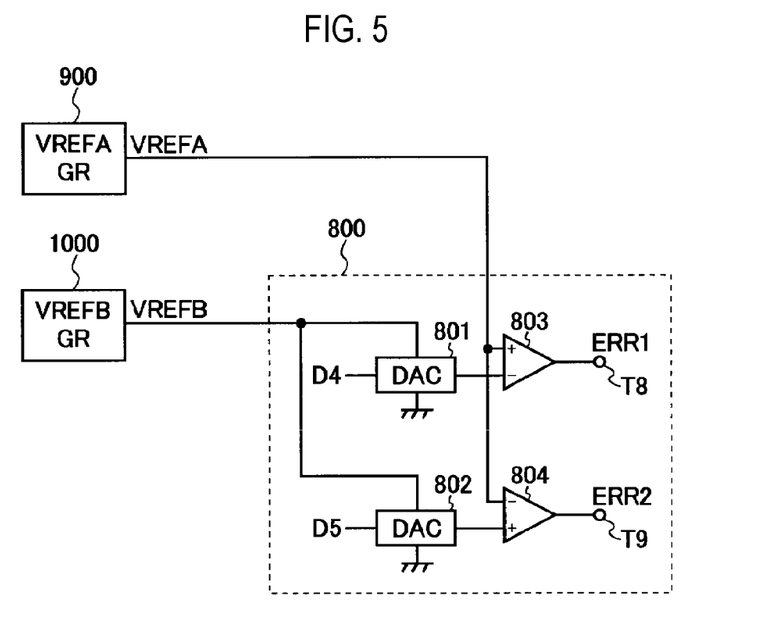
FIG. 5 is a diagram showing a configuration example of a determination circuit.

FIG. 5 shows an example of the determination circuit for determining whether or not the reference voltage VREFA falls within a predetermined range. The determination circuit 800 shown in FIG. 5 includes a fourth D/A converter 801, a fifth D/A converter 802, a third comparator 803 and a fourth comparator 804. A reference voltage generation circuit 900 generates a reference voltage VREFA. A reference voltage generation circuit 1000 generates a reference voltage VREFB. The fourth D/A converter 801 is an example of a "fourth D/A converter" recited in the claims, and the fifth D/A converter 802 is an example of a "fifth D/A converter" recited in the claims.

Fourth digital data D4 is supplied to an input terminal of the fourth D/A converter 801. The fourth D/A converter 801 divides the reference voltage VREFB at a voltage division ratio corresponding to the fourth digital data D4, and outputs an analog voltage which is a divided voltage of the reference voltage VREFB. The output terminal of the fourth D/A converter 801 is connected to an inverting input terminal of the third comparator 803. A reference voltage VREFA is supplied to a non-inverting input terminal of the third comparator 803. The third comparator 803 compares the reference voltage VREFA with the output voltage of the fourth D/A converter 801 and asserts a HIGH active first abnormality signal ERR1 if the reference voltage VREFA exceeds the output voltage of the fourth D/A converter 801. The first abnormality signal ERR1 is outputted from a terminal T8 to the outside of the voltage monitoring circuit.

Fifth digital data D5 is supplied to an input terminal of the fifth D/A converter 802. The fifth D/A converter 802 divides the reference voltage VREFB at a voltage division ratio corresponding to the fifth digital data D5 and outputs an analog voltage which is a divided voltage of the reference voltage VREFB. The output terminal of the fifth D/A converter 802 is connected to a non-inverting input terminal of the fourth comparator 804. A reference voltage VREFA is supplied to an inverting input terminal of the fourth comparator 804. The fourth comparator 804 compares the reference voltage VREFA with the output voltage of the fifth D/A converter 802, and assets a HIGH active second abnormality signal ERR2 if the reference voltage VREFA is lower than the output voltage of the fifth D/A converter 802. The second abnormality signal ERR2 is outputted from a terminal T9 to the outside of the voltage monitoring circuit.

The reference voltage VREFB is independent of the reference voltage VREFA. As a result, if the first abnormality signal ERR1 or the second abnormality signal ERR2 is asserted, the reference voltage VREFA is actually outside the predetermined range, or it is erroneously detected by the determination circuit 800 that the reference voltage VREFA is outside the predetermined range due to the occurrence of an abnormality in the reference voltage VREFB. In other words, in the determination circuit 800, the reference voltage VREFA and the reference voltage VREFB are mutually monitored. The first abnormality signal ERR1 or the second abnormality signal ERR2 is asserted if an abnormality occurs in one of the reference voltage VREFA and the reference voltage VREFB. In the case where the first abnormality signal ERR1 or the second abnormality signal ERR2 is asserted, for example, the power supply device for outputting a voltage to be monitored by the voltage monitoring circuit may be shut down. Alternatively, for example, the entire IC on which the power supply device for outputting the voltage to be monitored by the voltage monitoring circuit is mounted may be shut down. Alternatively, for example, a notification device such as a lamp, a speaker, a liquid crystal display device or the like may be used to notify an abnormal state without executing the shutdown.

<2. Semiconductor Integrated Circuit Device>

Figure 6:
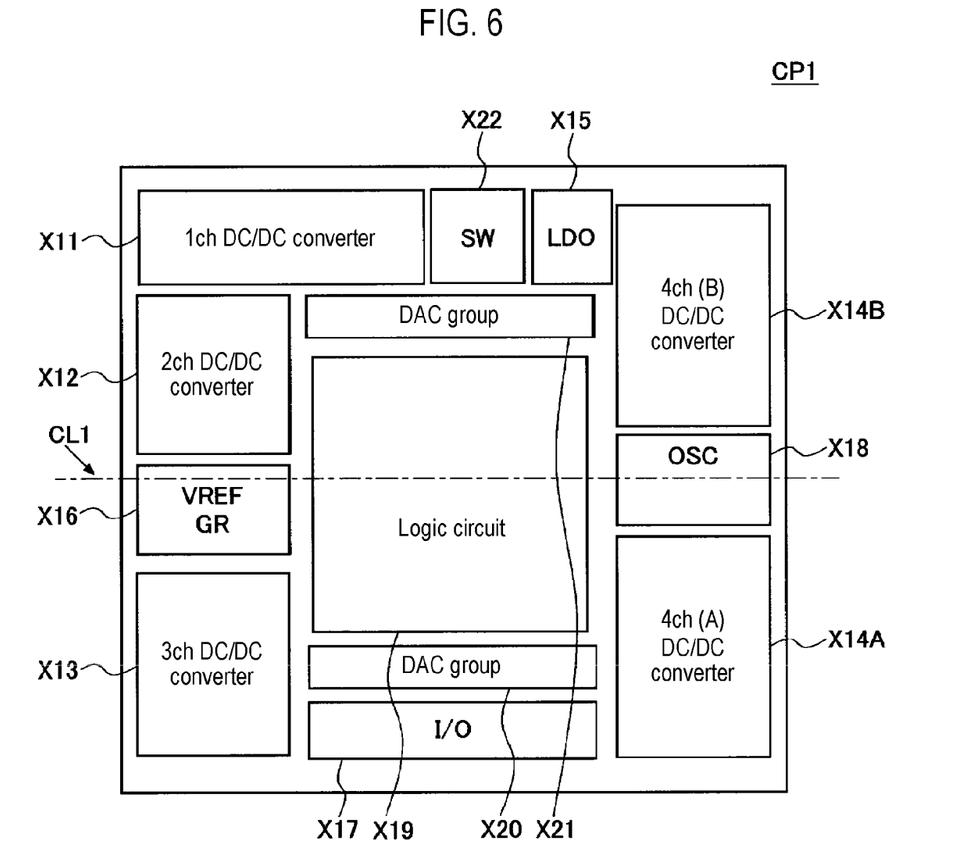
FIG. 6 is a diagram showing a chip layout example of a semiconductor integrated circuit device.

FIG. 6 is a diagram showing an example of a chip layout of a semiconductor integrated circuit device X1. A chip CP1 of the semiconductor integrated circuit device X1 includes a 1ch DC/DC converter X11, a 2ch DC/DC converter X12, a 3ch DC/DC converter X13, a 4ch (A) DC/DC converter X14A, a 4ch (B) DC/DC converter X14B, an LDO (Low Dropout) X15 which is a linear regulator with a small dropout voltage, a reference voltage generation circuit X16, an I/O X17, an oscillator X18, a logic circuit X19, a DAC group X20, a DAC group X21 and a load switch X22.

The 1ch DC/DC converter X11, the 2ch DC/DC converter X12 and the 3ch DC/DC converter X13 may be different types of DC/DC converters, respectively, or at least two of them may be DC/DC converters of the same type. The 4ch DC/DC converter divided and arranged into the 4ch (A) DC/DC converter X14A and the 4ch (B) DC/DC converter X14B is a DC/DC converter having a larger rated current than the 1ch to 3ch DC/DC converters X11 to X13. In addition, the output voltage of the 1ch DC/DC converter X11, the output voltage of the 2ch DC/DC converter X12, the output voltage of the 3ch DC/DC converter X13, the output voltage of the 4ch DC/DC converter and the output voltage of the LDO X15 may be different set values from each other, or at least two of them may be the same set value. In the present embodiment, the number of DC/DC converters is four. However, the number of DC/DC converters may be singular or may be a plural number other than 4. Further, in the present embodiment, the number of linear regulators is one. However, the number of linear regulators may be plural. Unlike the present embodiment, the semiconductor integrated circuit device X1 may be configured so as not to include a linear regulator. Conversely, the semiconductor integrated circuit device X1 may be configured so as not to include a DC/DC converter.

The 1ch DC/DC converter X11 may be provided with all the components constituting a DC/DC converter, or may be provided with a part of all the components constituting a DC/DC converter. In the case where the 1ch DC/DC converter X11 includes a part of all the components constituting a DC/DC converter, for example, components such as an inductor, an output capacitor and the like, which are difficult to integrate, may be used as external components of the semiconductor integrated circuit device X1. The 2ch DC/DC converter X12 and the 3ch DC/DC converter X13 are also the same as the 1ch DC/DC converter X11.

The 4ch DC/DC converter includes a part of all the components constituting a DC/DC converter. The inductor and the output capacitor of the 4ch DC/DC converter are external components of the semiconductor integrated circuit device X1. The 4ch (A) DC/DC converter X14A includes, for example, a timing control circuit 5, an upper MOS transistor Q1, a lower MOS transistor Q2, an error amplifier 6, a slope circuit 7 and a PWM comparator 8, which are shown in FIG. 2. The 4ch (B) DC/DC converter X14B has the same configuration as the 4ch (A) DC/DC converter X14A. In the 4ch DC/DC converter, the substrate wiring to which the output voltage generated by the 4ch (A) DC/DC converter X14A and the external components is transmitted, and the substrate wiring to which the output voltage generated by the 4ch (B) DC/DC converter X14B and the external components is transmitted, are connected in common.

The LDO X15 may include all the components constituting a linear regulator or may include a part of all the components constituting a linear regulator. In the case where the LDO X15 includes a part of all the components constituting a linear regulator, for example, components such as an output capacitor and the like, which are difficult to integrate, may be used as external components of the semiconductor integrated circuit device X1.

The reference voltage generation circuit X16 includes reference voltage generation circuits 900 and 1000, and generates reference voltages VREFA and VREFB, respectively. The reference voltage generation circuit X16 also includes a determination circuit 800 and also monitors both the reference voltage VREFA and the reference voltage VREFB.

The I/O X17 is an input/output interface of the semiconductor integrated circuit device X1. The I/O X17 receives input data sent from outside the semiconductor integrated circuit device X1 and transmits the input data to the logic circuit X19. The I/O X17 transmits the output data sent from the logic circuit X19 to the outside of the semiconductor integrated circuit device X1.

The oscillator X18 generates a clock signal shared by the 1ch DC/DC converter X11, the 2ch DC/DC converter X12, the 3ch DC/DC converter X13, the 4ch DC/DC converter and the logic circuit X17.

Figure 7:
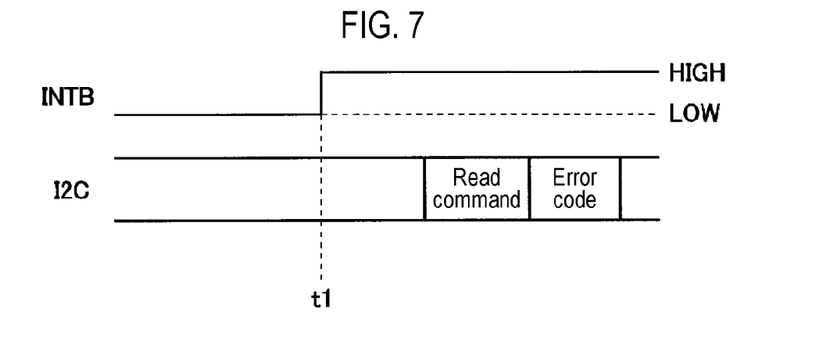
FIG. 7 is a timing chart of an interrupt signal and an I2C signal.

When one of the ten detection signals is asserted (after time t1 shown in FIG. 7), the logic circuit X19 asserts a HIGH active interrupt signal INTB as shown in FIG. 7. The ten detection signals are an overvoltage detection signal and a low voltage detection signal outputted from a voltage monitoring circuit for monitoring the output voltage of the 1ch DC/DC converter X11, an overvoltage detection signal and a low voltage detection signal outputted from a voltage monitoring circuit for monitoring the output voltage of the 2ch DC/DC converter X12, an overvoltage detection signal and a low voltage detection signal outputted from a voltage monitoring circuit for monitoring the output voltage of the 3ch DC/DC converter X13, an overvoltage detection signal and a low voltage detection signal outputted from a voltage monitoring circuit for monitoring the output voltage of the 4ch DC/DC converter, and an overvoltage detection signal and a low voltage detection signal outputted from a voltage monitoring circuit for monitoring the output voltage of the LDO X15.

The interrupt signal INTB is transmitted from the semiconductor integrated circuit device X1 to, for example, a microcomputer (not shown). The semiconductor integrated circuit device X1 and the microcomputer (not shown) perform, for example, I2C communication. For example, as shown in FIG. 7, if the microcomputer transmits a read command to the semiconductor integrated circuit device X1 by I2C communication after the interrupt signal INTB is asserted, the logic circuit X17 of the semiconductor integrated circuit device X1 returns an error code indicating which detection signal was asserted, to the microcomputer. When one of the ten detection signals is asserted, the logic circuit X17 of the semiconductor integrated circuit device X1 stores the asserted detection signal in an internal register.

Returning to FIG. 6, the DAC group X20 includes: a reference voltage generation circuit 400, a switch 600, a first threshold voltage generation circuit 1 and a second threshold voltage generation circuit 2, which are used in the 3ch DC/DC converter X13; and a reference voltage generation circuit 400, a switch 600, a first threshold voltage generation circuit 1 and a second threshold voltage generation circuit 2, which are used in the 4ch (A) DC/DC converter X14A. Since the 4ch (A) DC/DC converter X14A and the 4ch (B) DC/DC converter X14B operate in a pair, the reference voltage generation circuit 400, the switch 600, the first threshold voltage generation circuit 1 and the second threshold voltage generation circuit 2, which are used in the 4ch (A) DC/DC converter X14A, are also shared by the 4ch (B) DC/DC converter X14B.

The DAC group X21 includes: a reference voltage generation circuit 400, a switch 600, a first threshold voltage generation circuit 1 and a second threshold voltage generation circuit 2, which are used in the 1ch DC/DC converter X11; a reference voltage generation circuit 400, a switch 600, a first threshold voltage generation circuit 1 and a second threshold voltage generation circuit 2, which are used in the 2ch DC/DC converter X12; and a reference voltage generation circuit 400, a switch 600, a first threshold voltage generation circuit 1 and a second threshold voltage generation circuit 2, which are used in the LDO X15.

The load switch X22 sequentially controls the input voltage VIN and outputs the input voltage VIN.

The 1ch DC/DC converter X11 also includes a portion of the voltage monitoring circuit 100 excluding the first threshold voltage generation circuit 1 and the second threshold voltage generation circuit 2. The portion of the voltage monitoring circuit 100 excluding the first threshold voltage generation circuit 1 and the second threshold voltage generation circuit 2 is arranged at a position closer to the logic circuit X19 than the center position of the 1ch DC/DC converter X11. The 2ch DC/DC converter X12, the 3ch DC/DC converter X13, the 4ch (A) DC/DC converter X14A, the 4ch (B) DC/DC converter X14B and the LDO X15 are also the same as the 1ch DC/DC converter X11.

The chip CP1 mainly has features and effects (F1) to (F4) as described below. The features and effects such as (F1) and (F4) described below can also be applied to chips not equipped with a voltage monitoring circuit.

(F1) The logic circuit is arranged in the center of the chip. As a result, the power supply circuits (the 1ch DC/DC converter X11, the 2ch DC/DC converter X12, the 3ch DC/DC converter X13, the 4ch (A) DC/DC converter X14A, the 4ch (B) DC/DC converter X14B and the LDO X15 in present embodiment), which are circuits having a large heat generation amount, can be dispersedly arranged on the outer edge side of the chip.

(F2) The D/A converter of the voltage monitoring circuit is provided at a position closer to the logic circuit than the portion of the voltage monitoring circuit excluding the D/A converter. Thus, it is possible to reduce the space occupied by the wiring that connects the D/A converter of the voltage monitoring circuit and the logic circuit.

(F3) In the above (F2), the D/A converter of the voltage monitoring circuit is arranged next to the logic circuit. This makes it possible to further reduce the space occupied by the wiring that connects the D/A converter of the voltage monitoring circuit and the logic circuit.

(F4) The chip has a rectangular shape. The respective elements mounted on the chip of one DC/DC converter (the 4ch DC/DC converter in the present embodiment) are arranged in line symmetry about a center line (center line CL in this example) that connects a midpoint of a first side of the chip and a midpoint of a second side opposing the first side. Thus, one element group (the element group belonging to the 4ch (A) DC/DC converter X14A in the present embodiment) and the other element group (the element group belonging to the 4ch (B) DC/DC converter X14B in present embodiment) divided and arranged in line symmetry can be made uniform in characteristics, and the balance between the two groups can be maintained in terms of heat generation and the like.

Figure 8:
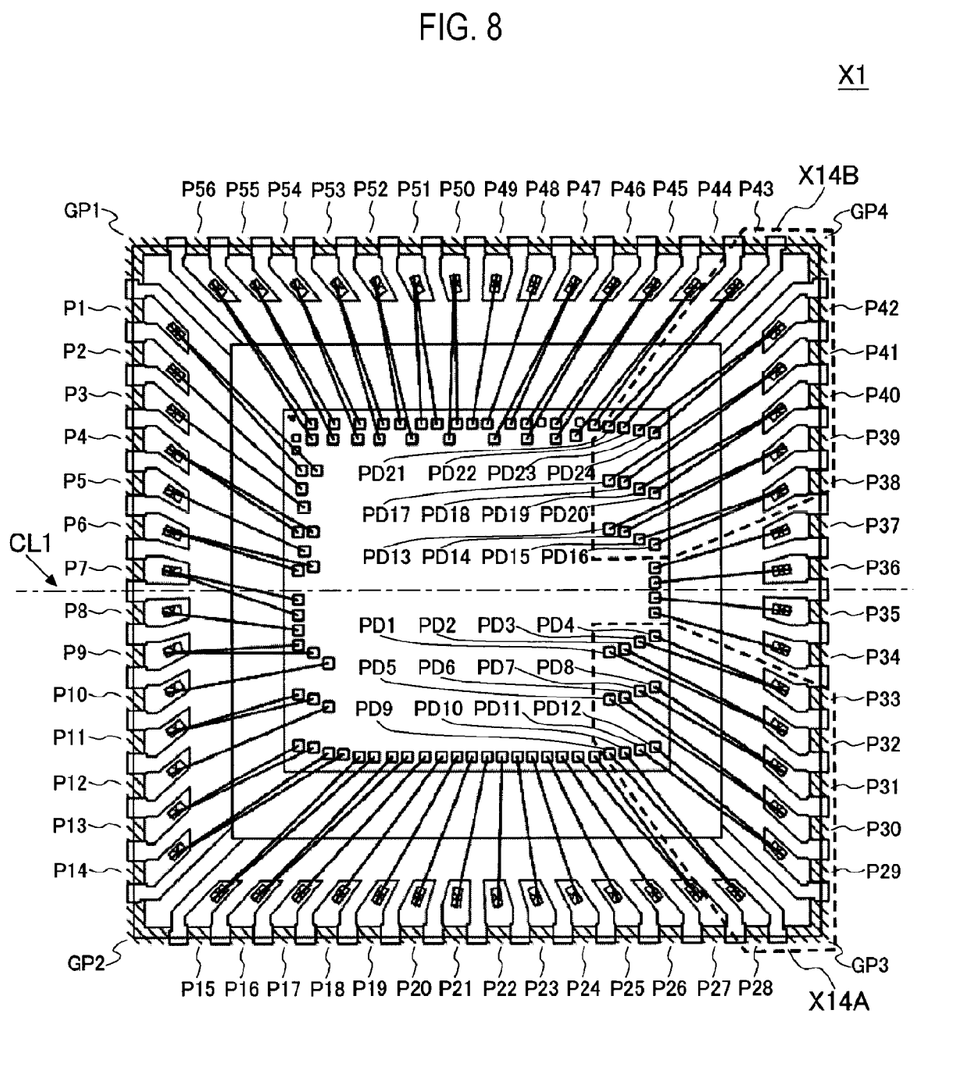
FIG. 8 is a diagram showing an example of a pin arrangement of a semiconductor integrated circuit device

As shown in FIG. 8, the semiconductor integrated circuit device X1 includes the above-described chip CP1, first to fifty-six pins P1 to P56, ground pins GP1 to GP4, and bonding wires. The semiconductor integrated circuit device X1 mainly has features and effects (F5) to (F7) as described below. The features and effects such as (F5) to (F7) described below can also be applied to semiconductor integrated circuit devices not equipped with a voltage monitoring circuit.

(F5) The chip and the package have a rectangular shape. The respective pads of one DC/DC converter (the 4ch DC/DC converter in present embodiment) are arranged in line symmetry about a center line that connects a midpoint of a first side of each of the chip and the package and a midpoint of a second side opposing the first side. In the present embodiment, the pads PD1 to PD12 belonging to the 4ch (A) DC/DC converter X14A and the pads PD13 to PD24 belonging to the 4ch (B) DC/DC converter X14B are arranged in line symmetry about a center line CL1. Thus, one element group (the element group belonging to the 4ch (A) DC/DC converter X14A in present embodiment) and the other element group (the element group belonging to the 4ch (B) DC/DC converter X14B in the present embodiment) divided and arranged in line symmetry can be made more uniform in characteristics, and the balance between the two groups can be further maintained in terms of heat generation and the like.

(F6) The chip and the package have a rectangular shape. The respective pins of one DC/DC converter (the 4ch DC/DC converter in present embodiment) are arranged in line symmetry about a center line that connects a midpoint of a first side of each of the chip and the package and a midpoint of a second side opposing the first side. In present embodiment, the pins P28 to P33 belonging to the 4ch (A) DC/DC converter X14A and the pins P38 to P43 belonging to the 4ch (B) DC/DC converter X14B are arranged in line symmetry about a center line CL1. Thus, one element group (the element group belonging to the 4ch (A) DC/DC converter X14A in the present embodiment) and the other element group (the element group belonging to the 4ch (B) DC/DC converter X14B in the present embodiment) divided and arranged in line symmetry can be made more uniform in characteristics, and the balance between the two groups can be further maintained in terms of heat generation and the like.

(F7) The chip and the package have a rectangular shape. The respective bonding wires of one DC/DC converter (the 4ch DC/DC converter in the present embodiment) are arranged in line symmetry about a center line that connects a midpoint of a first side of each of the chip and the package and a midpoint of a second side opposing the first side. In the present embodiment, the bonding wires belonging to the 4ch (A) DC/DC converter X14A and the bonding wires belonging to the 4ch (B) DC/DC converter X14B are arranged in line symmetry about a center line CL1. For example, the bonding wire connecting the pad PD1 and the pin P32 is in line symmetry about the center line CL1 with respect to the bonding wire connecting the pad PD13 and the pin P39. Thus, one element group (the element group belonging to the 4ch (A) DC/DC converter X14A in the present embodiment) and the other element group (the element group belonging to the 4ch (B) DC/DC converter X14B in the present embodiment) divided and arranged in line symmetry can be made more uniform in characteristics, and the balance between the two groups can be further maintained in terms of heat generation and the like.

Figure 9:
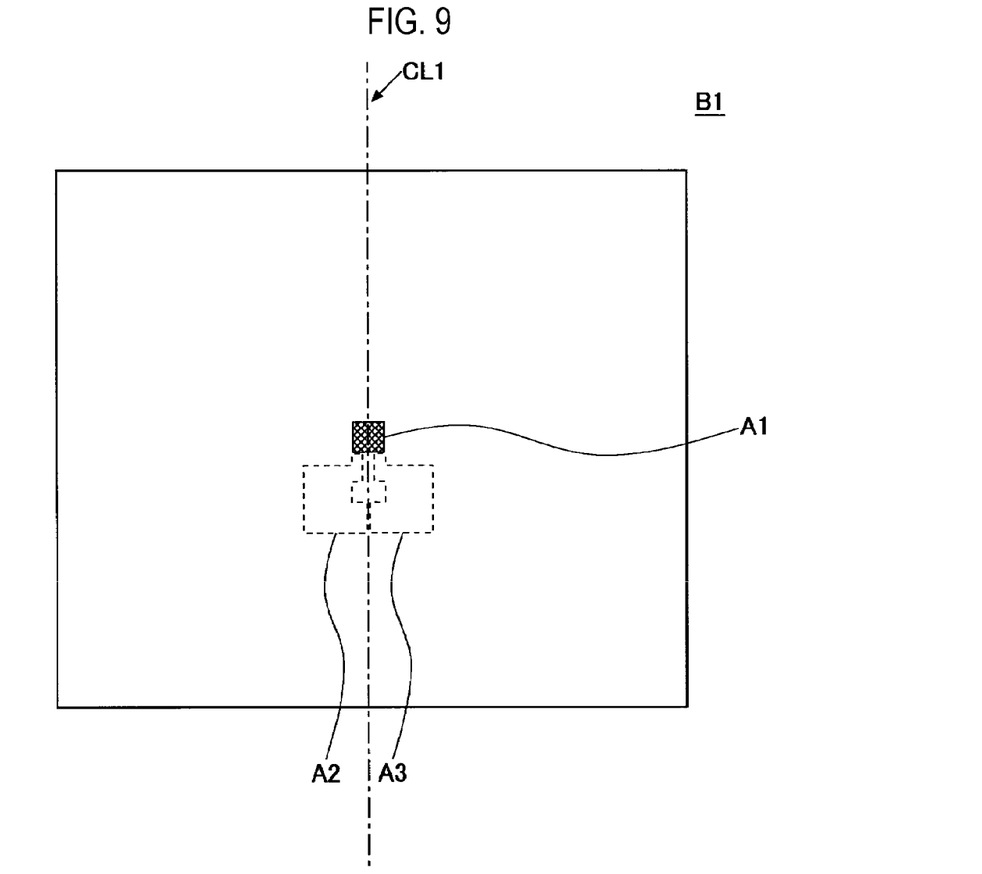
FIG. 9 is a schematic top view showing an example of a substrate on which a semiconductor integrated circuit device is mounted.

The semiconductor integrated circuit device X1 is mounted on, for example, a printed circuit board B1 shown in FIG. 9. The printed circuit board B1 is provided with a mounting region A1 of the semiconductor integrated circuit device X1 in the central portion thereof. The printed circuit board B1 mainly has a feature and an effect (F8) described below. The feature and effect such as (F8) described below can also be applied to a printed circuit board on which a semiconductor integrated circuit device not equipped with a voltage monitoring circuit is mounted.

(F8) The chip and the package have a rectangular shape. The wiring and the component mounting region of the printed circuit board associated with one DC/DC converter (the 4ch DC/DC converter in the present embodiment) are arranged in line symmetry about a center line (center line CL1 in the present embodiment) that connects a midpoint of a first side of each of the chip and the package and a midpoint of a second side opposing the first side in the case where the semiconductor integrated circuit device is mounted on the mounting region of the semiconductor integrated circuit device of the printed circuit board. In the present embodiment, the wiring and the region A2 including the inductor mounting region and the output capacitor mounting region of the printed circuit board B1 associated with the 4ch (A) DC/DC converter X14A are arranged in line symmetry about the center line CL1 with respect to the wiring and the region A3 including the inductor mounting region and the output capacitor mounting region of the printed circuit board B1 associated with the 4ch (B) DC/DC converter X14B.

In the semiconductor integrated circuit device X1, the reference voltage generation circuit 400 (see FIG. 1), the first threshold voltage generation circuit 1 (see FIG. 1) and the second threshold voltage generation circuit 2 (see FIG. 1) make use of different D/A converters and different operational amplifiers. Therefore, it is necessary to cancel errors generated in each D/A converter and each operational amplifier. It is also necessary to cancel the characteristics of the current mirror circuit of the first threshold voltage generation circuit 1 and the errors of the respective resistances of the first threshold voltage generation circuit 1 and the second threshold voltage generation circuit 2.

Figure 10:
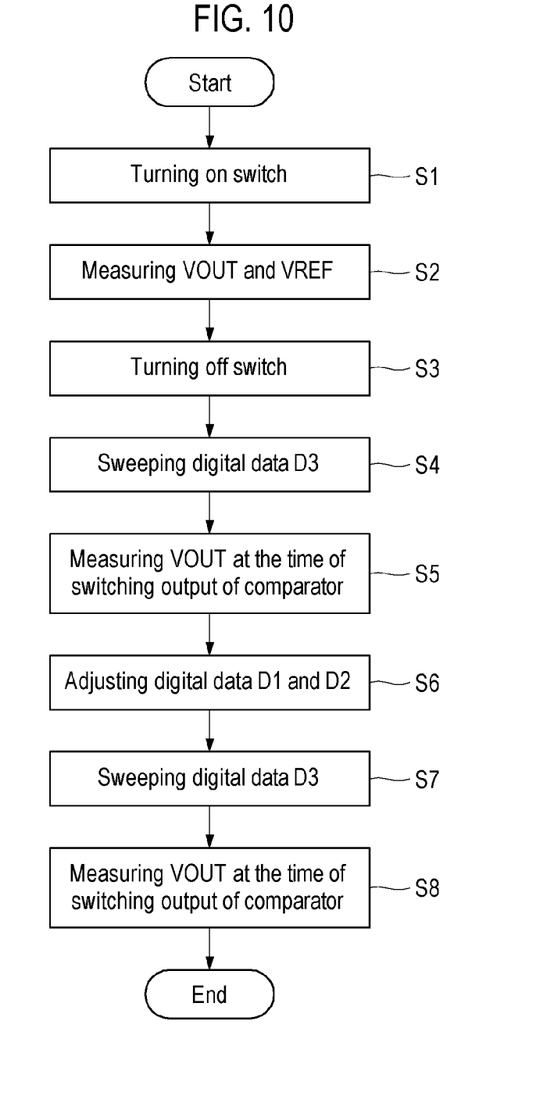
FIG. 10 is a flowchart showing a test procedure example of a semiconductor integrated circuit device.

Therefore, for example, a test of the procedure shown in FIG. 10 is performed on the semiconductor integrated circuit device X1. Here, a test on the voltage monitoring circuit 100 that monitors the output voltage of one DC/DC converter will be described as an example. First, the switch 600 (see FIG. 1) is turned on (step S1). Since the switch 600 is a normally-on switch, special processing is not necessary in step S1.

Next, an external measurement device measures the output voltage VOUT of the DC/DC converter 500 (see FIG. 1) outputted to the terminal T5 (see FIG. 1) and the reference voltage VREF outputted to the terminal T7 (see FIG. 1) (step S2).

Next, the logic circuit X17 supplies a switch control signal to the semiconductor integrated circuit device X1 to turn off the switch 600 (step S3).

Next, the logic circuit X17 applies the same voltage as the reference voltage VREF measured in step S2 to the terminal T7. At this time, the voltage applied to the terminal T7 is monitored from the terminal T6 to correct the voltage. Then, the logic circuit X17 sweeps the third digital data D3 (step S4). As a result, the voltages at the terminals T5 and T3 are changed.

Next, the logic circuit X17 stops the sweeping of the third digital data D3 when the overvoltage detection signal SOVD is switched from negation to assertion. The voltage of the terminal T5 at this time is measured (step S5). Likewise, when the low voltage detection signal SUVD is switched from negation to assertion, the sweeping of the third digital data D3 is stopped. The voltage of the terminal T5 at this time is measured (step S5).

Next, the logic circuit X17 adjusts the value of the first digital data D1 based on the value of the output voltage VOUT of the DC/DC converter 500 when the overvoltage detection signal SOVD measured in step S5 is switched from negation to assertion (step S6). Further, the logic circuit X17 adjusts the value of the second digital data D2 based on the value of the output voltage VOUT of the DC/DC converter 500 when the low voltage detection signal SUVD measured in step S5 is switched from negation to assertion (step S6).

Upon completion of the adjustment in step S6, the logic circuit X17 monitors the voltage of the terminal T5 again while sweeping the third digital data D3 (step S7). Then, the logic circuit X17 measures again the value of the output voltage VOUT of the DC/DC converter 500 when the overvoltage detection signal SOVD is switched from negation to assertion and the value of the output voltage VOUT of the DC/DC converter 500 when the low voltage detection signal SUVD is switched from negation to assertion (step S8). If there is no problem in the measured value, the test is terminated.

<3. Application>

Figure 11:
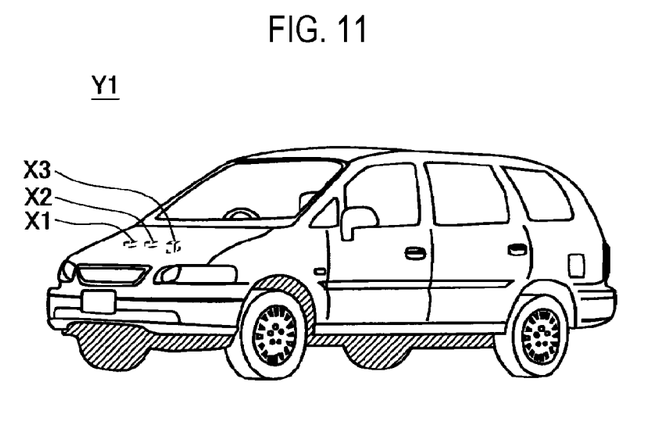
FIG. 11 is an external view of a vehicle.

Next, an application example of the semiconductor integrated circuit device X1 described above will be described. FIG. 11 is an external view of a vehicle. The vehicle Y1 is equipped with a semiconductor integrated circuit device X1, an external component group X2 of the semiconductor integrated circuit device X1 and a battery X3.

The battery X3 supplies the input voltage VIN to the semiconductor integrated circuit device X1. The input voltage VIN is converted into the output voltage VOUT by the semiconductor integrated circuit device X1 and the component group X2. The output voltage VOUT is used, for example, as a power supply voltage of an electronic device mounted on the vehicle Y1.

<4. Other>

In addition to the above embodiments, the configuration of the present disclosure may be modified in various ways without departing from the spirit of the present disclosure.

For example, in the above-described embodiments, the MOSFET is used as the switching element of the DC/DC converter. Alternatively, a bipolar transistor may be used as the switching element of the DC/DC converter.

Furthermore, in the above-described embodiments, the power supply device mounted on the vehicle is described as an application example of the power supply device. However, the present disclosure is not limited thereto. The present disclosure may be used for monitoring an output voltage of a power supply device used in all fields (home electronics field, automobile field, industrial machine field, etc.).

As described above, the above embodiments are exemplary in all respects and should be considered to be not restrictive. The technical scope of the present disclosure is not defined by the above description of the embodiments but by the claims. It should be understood that all modifications falling within the meaning and scope equivalent to the scope of the claims are included in the technical scope of the present disclosure.

According to the voltage monitoring circuit disclosed herein, it is possible to easily enhance the monitoring accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A voltage monitoring circuit for monitoring an output voltage of a power supply device, which includes a voltage conversion part that converts an input voltage to the output voltage according to a difference between a feedback voltage based on the output voltage and a first reference voltage, comprising:
   a threshold voltage generation circuit configured to generate a threshold voltage from the first reference voltage; and
   a comparator configured to compare the threshold voltage with the feedback voltage, wherein the threshold voltage generation circuit includes
a first threshold voltage generation circuit and a second
threshold voltage generation circuit,
wherein the first threshold voltage generation circuit
includes a first D/A converter and a current mirror
circuit, and is configured to:
generate a first threshold voltage;
change the first threshold voltage according to first
digital data inputted to the first D/A converter; and
change an input current of the current mirror circuit
according to the first digital data inputted to the first
D/A converter,
wherein an output current of the current mirror circuit is
approximately proportional to a value obtained by
subtracting the first reference voltage from the first
threshold voltage,
wherein the second threshold voltage generation circuit
includes a second D/A converter, and is configured to:
generate a second threshold voltage smaller than the
first threshold voltage; and
change the second threshold voltage according to second digital data inputted to the second D/A converter,
wherein the comparator includes a first comparator and a second comparator,
wherein the first comparator compares the first threshold voltage with the feedback voltage, and
wherein the second comparator compares the second threshold voltage with the feedback voltage.

2. The circuit of claim 1, wherein the second threshold voltage generation circuit includes a voltage division circuit configured to generate the second threshold voltage which is a divided voltage of the first reference voltage, a voltage division ratio of the voltage division circuit being changed according to the second digital data inputted to the second D/A converter.

3. The circuit of claim 1, wherein the threshold voltage generation circuit includes a third D/A converter and is configured to change the threshold voltage according to third digital data inputted to the third D/A converter.

4. The circuit of claim 1, further comprising: a determination circuit configured to set a predetermined range based on a third reference voltage independent of a second reference voltage and to determine whether or not the second reference voltage falls within the predetermined range, the first reference voltage being generated from the second reference voltage.

5. The circuit of claim 4, wherein the determination circuit includes a fourth D/A converter configured to generate an upper limit voltage corresponding to an upper limit of the predetermined range from the third reference voltage, and a fifth D/A converter configured to generate a lower limit voltage corresponding to a lower limit of the predetermined range from the third reference voltage, to change the upper limit voltage according to fourth digital data inputted to the fourth D/A converter, and to change the lower limit voltage according to fifth digital data inputted to the fifth D/A converter.

6. A semiconductor integrated circuit device, comprising: a reference voltage generation circuit configured to generate the first reference voltage; at least a part of the voltage conversion part; and the voltage monitoring circuit of claim 1.

7. The device of claim 6, wherein the reference voltage generation circuit includes a sixth D/A converter configured to generate the first reference voltage from a second reference voltage and to change the first reference voltage according to sixth digital data inputted to the sixth D/A converter.

8. The device of claim 6, further comprising: a switch provided between the reference voltage generation circuit and the threshold voltage generation circuit.

9. A vehicle, comprising: the semiconductor integrated circuit device of claim 6.

10. A voltage monitoring circuit for monitoring an output voltage of a power supply device, which includes a voltage conversion part that converts an input voltage to the output voltage according to a difference between a feedback voltage based on the output voltage and a first reference voltage, comprising:
a threshold voltage generation circuit configured to generate a threshold voltage from the first reference voltage; and
a comparator configured to compare the threshold voltage with the feedback voltage,
wherein the threshold voltage generation circuit includes a first threshold voltage generation circuit and a second threshold voltage generation circuit,
wherein the first threshold voltage generation circuit includes a first D/A converter, and is configured to:
generate a first threshold voltage; and
change the first threshold voltage according to first digital data inputted to the first D/A converter,
wherein the second threshold voltage generation circuit includes a second D/A converter and a voltage division circuit, and is configured to:
generate a second threshold voltage smaller than the first threshold voltage;
change the second threshold voltage according to second digital data inputted to the second D/A converter; and
generate the second threshold voltage which is a divided voltage of the first reference voltage, a voltage division ratio of the voltage division circuit being changed according to the second digital data inputted to the second D/A converter,
wherein the comparator includes a first comparator and a second comparator,
wherein the first comparator compares the first threshold voltage with the feedback voltage, and
wherein the second comparator compares the second threshold voltage with the feedback voltage.

11. The circuit of claim 10, wherein the threshold voltage generation circuit includes a third D/A converter and is configured to change the threshold voltage according to third digital data inputted to the third D/A converter.

12. The circuit of claim 10, further comprising:
a determination circuit configured to set a predetermined range based on a third reference voltage independent of a second reference voltage and to determine whether or not the second reference voltage falls within the predetermined range, the first reference voltage being generated from the second reference voltage.

13. The circuit of claim 12, wherein the determination circuit includes a fourth D/A converter configured to generate an upper limit voltage corresponding to an upper limit of the predetermined range from the third reference voltage, and a fifth D/A converter configured to generate a lower limit voltage corresponding to a lower limit of the predetermined range from the third reference voltage, to change the upper limit voltage according to fourth digital data inputted to the fourth D/A converter, and to change the lower limit voltage according to fifth digital data inputted to the fifth D/A converter.

14. A semiconductor integrated circuit device, comprising:
   a reference voltage generation circuit configured to generate the first reference voltage;
   at least a part of the voltage conversion part; and
   the voltage monitoring circuit of claim 10.

15. The device of claim 14, wherein the reference voltage generation circuit includes a sixth D/A converter configured to generate the first reference voltage from a second reference voltage and to change the first reference voltage according to sixth digital data inputted to the sixth D/A converter.

16. The device of claim 14, further comprising:
   a switch provided between the reference voltage generation circuit and the threshold voltage generation circuit.

17. A vehicle, comprising:
   the semiconductor integrated circuit device of claim 14.

* * * * *